United States Patent [19]
Wu et al.

[11] Patent Number: 5,753,540
[45] Date of Patent: May 19, 1998

[54] APPARATUS AND METHOD FOR PROGRAMMING ANTIFUSE STRUCTURES

[75] Inventors: Koucheng Wu; Ivan Sanchez, both of San Antonio; Yu-Pin Han, Dallas, all of Tex.; Ying-Tsong Loh, Saratoga, Calif.

[73] Assignee: VLSI Technology, Inc., San Jose, Calif.

[21] Appl. No.: 699,867

[22] Filed: Aug. 20, 1996

[51] Int. Cl.$^6$ .................................... H01L 21/82
[52] U.S. Cl. ................ 438/131; 438/467; 438/469
[58] Field of Search ............................ 438/131, 467, 438/469, 468

[56] References Cited

U.S. PATENT DOCUMENTS

| | | | |
|---|---|---|---|
| 4,174,521 | 11/1979 | Neale | 357/45 |
| 4,420,766 | 12/1983 | Kasten | 357/59 |
| 4,441,167 | 4/1984 | Principi | 365/94 |
| 4,538,167 | 8/1985 | Yoshino et al. | 357/59 |
| 4,569,120 | 2/1986 | Stacy et al. | 29/574 |
| 5,070,384 | 12/1991 | McCollum et al. | 357/51 |
| 5,095,362 | 3/1992 | Roesner | 357/23.4 |
| 5,106,773 | 4/1992 | Chen et al. | 437/51 |
| 5,120,679 | 6/1992 | Boardman et al. | 437/195 |
| 5,126,282 | 6/1992 | Chiang et al. | 438/467 |
| 5,191,241 | 3/1993 | McCollum et al. | 307/465 |
| 5,210,598 | 5/1993 | Nakazaki et al. | 257/530 |
| 5,233,206 | 8/1993 | Lee et al. | 257/50 |
| 5,248,632 | 9/1993 | Tung et al. | 437/195 |
| 5,258,891 | 11/1993 | Sako | 361/792 |
| 5,272,388 | 12/1993 | Bakker | 438/467 |
| 5,272,666 | 12/1993 | Tsang et al. | 365/96 |
| 5,290,734 | 3/1994 | Boardman et al. | 437/195 |
| 5,298,784 | 3/1994 | Gambino et al. | 257/529 |
| 5,300,456 | 4/1994 | Tigelaar et al. | 257/530 |
| 5,302,546 | 4/1994 | Gordon et al. | 438/467 |
| 5,308,795 | 5/1994 | Hawley et al. | 437/192 |
| 5,311,039 | 5/1994 | Kimura et al. | 257/50 |
| 5,316,971 | 5/1994 | Chiang et al. | |
| 5,328,868 | 7/1994 | Conti et al. | 437/203 |
| 5,373,169 | 12/1994 | McCollum et al. | 257/50 |
| 5,381,035 | 1/1995 | Chen et al. | 257/530 |
| 5,404,029 | 4/1995 | Husher et al. | 257/50 |
| 5,427,979 | 6/1995 | Chang | 437/190 |
| 5,434,432 | 7/1995 | Spratt et al. | 257/50 |
| 5,444,290 | 8/1995 | Paz De Araujo | 257/530 |
| 5,464,790 | 11/1995 | Hawley | 257/530 |
| 5,485,105 | 1/1996 | Harward et al. | 438/467 |
| 5,493,144 | 2/1996 | Bryant et al. | 257/530 |
| 5,493,146 | 2/1996 | Pramanik et al. | 257/530 |
| 5,502,315 | 3/1996 | Chua et al. | 257/50 |
| 5,557,136 | 9/1996 | Gordon et al. | 257/530 |
| 5,593,920 | 1/1997 | Haslam et al. | 257/530 |

FOREIGN PATENT DOCUMENTS

| | | | |
|---|---|---|---|
| 0 162 529 | 11/1985 | European Pat. Off. | H01L 29/32 |
| 0452091A2 | 10/1991 | European Pat. Off. | H01L 23/525 |
| 0483958A1 | 6/1992 | European Pat. Off. | H01L 23/525 |
| WO92/21154 | 11/1992 | European Pat. Off. | H01L 45/00 |
| WO 92/20109 | 12/1992 | European Pat. Off. | H01L 23/485 |
| WO93/05514 | 3/1993 | European Pat. Off. | H01L 29/68 |
| 0592077A1 | 1/1994 | European Pat. Off. | H01L 23/525 |
| 3927033A1 | 1/1990 | Germany | H01L 29/02 |
| 57-117255 | 7/1982 | Japan | H01L 21/88 |
| 58-83109609 | 10/1983 | Japan | |
| 6-242678 | 9/1994 | Japan | G03G 15/08 |

OTHER PUBLICATIONS

K.E. Gordon and R.J. Wong, "*Conducting Filament of the Programmed Metal Electrode Amorphous Silicon Antifuse,*" QuickLogic Corp., Santa Clara, CA, 1993 IEEE, International Electron Devices Meeting, Dec. 5–8, 1993, Washington, DC.

Unknown, "*Developments in non–volatile FPGAs,*" Electronic Engineering,, Apr. 1993.

*Primary Examiner*—John Niebling
*Assistant Examiner*—Richard A. Booth
*Attorney, Agent, or Firm*—Hickman & Martine, LLP

[57] ABSTRACT

Disclosed is a method for programming an antifuse structure. The antifuse structure is programmed by applying an alternating current having alternating current pulses between a bottom and a top electrode to generate a conduction path through an antifuse material sandwiched between the electrodes. The conduction path is formed incrementally due to an electron flow produced as a result of each alternating current pulse thereby defining the conduction path at a substantially centered portion of the antifuse material.

17 Claims, 7 Drawing Sheets

APPARATUS AND METHOD FOR PROGRAMMING ANTIFUSE STRUCTURES

CROSS REFERENCE TO RELATED APPLICATIONS

This application is related to U.S. patent application Ser. No. 08/699,866 filed concurrently herewith on behalf of Ivan Sanchez and Landon B. Vines, entitled "Doped Antifuse Structure and Method for Making Same," and assigned to the assignee of this application, the disclosure of which is hereby incorporated by reference.

BACKGROUND OF THE INVENTION

The present invention relates generally to integrated circuit (IC) chips, and more particularly, to improved methods for programming antifuse structures to reduce deprogramming failures.

Fuse and antifuse structures have been used in certain classes of IC chips such as field programmable gate arrays and, programmable read-only memories (PROMs) and the like. Field programmable gate arrays include a large number of logic elements, such as AND gates and OR gates, which can be selectively coupled together by means of fuses or antifuses to perform user designed functions. A fuse-type gate array is "programmed" by selectively "blowing" fuses within the device such that they become non-conductive, while an antifuse type gate array is "programmed" by causing selected antifuses to become conductive.

There are many types of PROMs including standard, write-once PROMs, erasable programmable read-only memories (EPROMs) and, electrically erasable programmable read-only memories (EEPROMs). A PROM usually comprises an array of memory cells arranged in rows and columns, which can be programmed to store user data.

Fuses for field programmable gate arrays, PROMs and the like are typically made from a titanium-tungsten (TiW) alloy and are shaped somewhat like a bow-tie having a narrow, central neck and wide ends. The neck of the fuse is typically about 2 microns wide, while the ends of the fuse are typically about 6 microns wide. When a sufficiently high voltage (usually on the order of 10 volts D.C.) is applied to the fuse, the current flowing through the fuse will cause it to heat-up (i.e., joule heat) and will eventually melt the fuse at its neck, thereby "blowing" the fuse. Fuses in electronic devices are much more prevalent today than antifuses because they are easier to manufacture and have a better record of reliability.

Antifuses, however, do have the very desirable feature of being small in size. For example, a TiW fuse with a 2 micron neck and 6 micron end width permits approximately 4,000 fuses to be provided on a typical device. In contrast, a 1 or 1.2 micron diameter antifuse via permits 80,000–100,000 antifuses to be formed on a single device. As a result, antifuses provide designers with the ability to form larger numbers of antifuses for storing information on a typical devices than fuse technology storage.

Antifuse structures include a material which initially has a high resistance but which can be converted into a low resistance material by the application of a programming voltage. Once programmed, these low resistance antifuse structures can couple together logic elements of a field programmable gate array so that the gate array will perform user-desired functions, or can serve as memory cells of a PROM.

Figure 1:
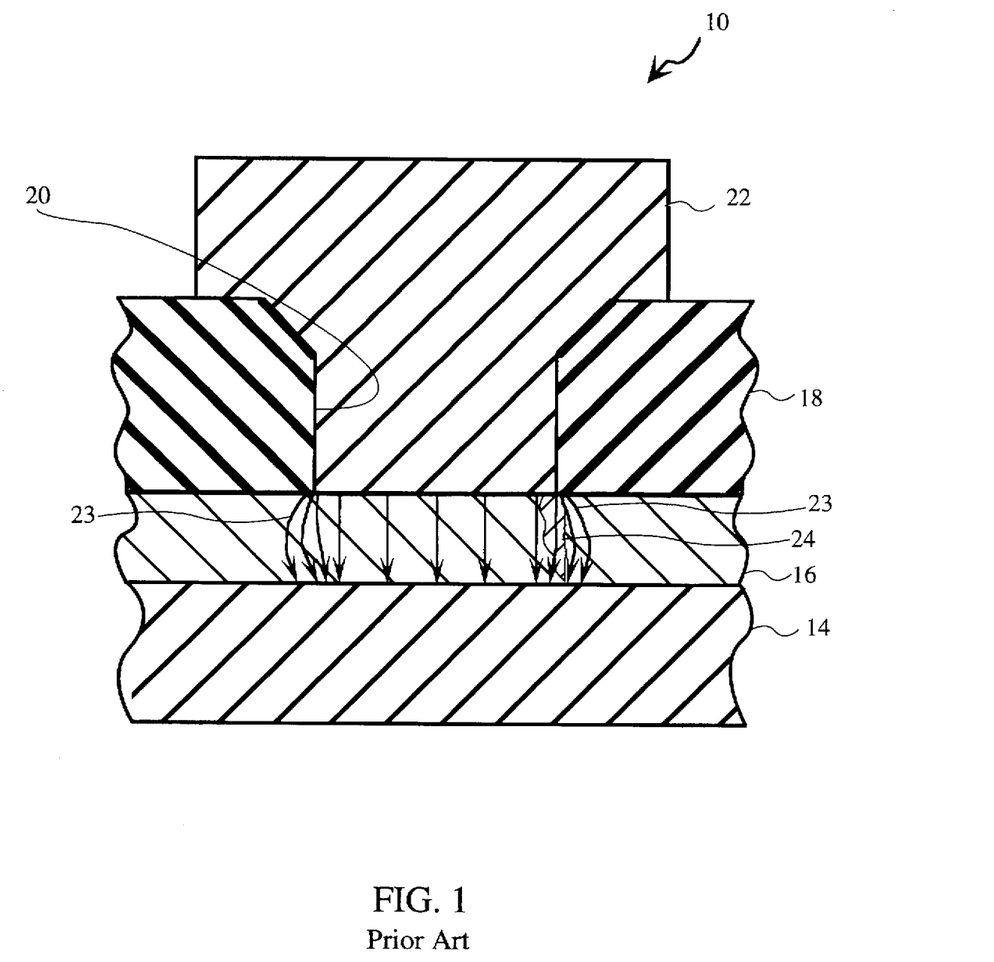
FIG. 1 is a cross sectional view of a prior art programmed antifuse structure with a conductive filament formed by a direct current programming process.

To facilitate further discussion, FIG. 1 schematically illustrates a cross section of a prior art antifuse structure 10.

Antifuse structure 10 includes a "metal-one" layer 14, which is typically formed over an oxide layer previously formed over a semiconductor substrate (e.g., a silicon wafer). Metal-one layer 14 typically includes titanium-tungsten and/or other suitable conductive materials and can be formed by a conventional physical vapor deposition (PVD) process, such as sputtering.

Once metal-one layer 14 is formed, an antifuse layer 16 is blanket deposited and patterned using a suitable photo-lithographic process. Antifuse layer 16 is No generally amorphous silicon (a-Si), which has an intrinsic resistivity of approximately one mega-ohm-centimeter, and which can be deposited using any number of well known processes, including chemical vapor deposition (CVD).

Following the amorphous silicon deposition, an intermetal oxide (IMO) layer 18, typically a silicon dioxide is deposited above antifuse layer 16 using any suitable CVD process. A via hole 20 is then etched through intermetal oxide layer 18 using a suitable photolithographic process and an appropriate etchant. The via hole 20 therefore extends through intermetal oxide layer 18 and stops at about antifuse layer 16. A "metal-two" layer 22 can then be used to fill via hole 20 and establish electrical contact with antifuse layer 16.

The antifuse structure of FIG. 1 is typically programmed by applying an appropriate programming voltage between metal-one layer 14 and metal-two layer 22. For a typical amorphous silicon-based antifuse, the programming voltage is, for example, between about 8–12 volts D.C. During the programming step, antifuse layer 16 will typically form a conductive filament 24. Conductive filament 24 is generally formed when conductive atoms from a metal layer migrate into antifuse layer 16. For more information on antifuse conductive filaments, reference can be made to a paper entitled "Conducting Filament of the Programmed Metal Electrode Amorphous Silicon Antifuse," Gordon et al., IEDM Tech. Dig., p. 27, December 1993, incorporated herein by reference.

A typical amorphous silicon-based antifuse structure 10 typically has a resistance of about 1–2 giga-ohms before programming (e.g., for a one micron diameter antifuse structure). After being programmed, the same antifuse structure 10 typically has a resistance of about 20 to 100 ohms. Although programming antifuses with direct current (D.C.) works well, the filament formation is generally formed near the edge of the via hole 20 as illustrated by a conductive filament 24. As is well known to those skilled in the art, conductive filament 24 will tend to abruptly form at the edges of via hole 20 because the electric field "E" 23 intensity is much stronger near the edges than in the center region. Consequently, once an antifuse is programmed, electrical conduction between metal-one layer 14 and metal-two layer 22 will likely be established through conductive filament 24 that formed near an edge. In situations where the resulting filament is programmed "thinly" (e.g., a narrow filament diameter is generated), there can be delays experienced in establishing conduction between the metal layers.

Another problem often encountered with conventional antifuses is known as "deprogramming" (also referred to as infant mortality failures), in which antifuses having been subjected to a programming voltage are later found to have reverted to an unprogrammed "off" state. In some cases, deprogramming is a result of thinly "programmed" antifuses which initially forms an inadequate conductive filament. By way of example, antifuses having inadequate filament formation tend to increase in resistance over time, and essentially become unprogrammed as opposed to remaining in a low resistive state. Deprogramming problems can also result in unsuspected future malfunctions which could potentially render entire integrated circuits implementing antifuses useless.

In view of the forgoing, what is needed is a method and apparatus for programming amorphous silicon antifuse structures which maintain their programmed status and thereby prevent infant mortality failures.

SUMMARY OF THE INVENTION

The present invention fills these needs by providing a method and apparatus for programming antifuse structures. The antifuse structures are programmed by applying an alternating current having alternating current pulses between a bottom and a top electrode to generate a conduction path through an antifuse material that is sandwiched between the electrodes. The conduction path is preferably formed incrementally by an electron flow produced as a result of each applied alternating current pulse, thereby defining the conduction path at a substantially centered portion of the antifuse material.

Advantageously, the conduction path is formed away from the edges of the top and bottom electrodes since the impedance is lower (i.e., capacitance is higher) near the center of a the antifuse structure. Further, an advantage is realized by applying half-wave rectified AC signals across the antifuse structure. By way of example, when the polarity of a half-wave rectified signal is selected to be either positive or negative, the direction in which electrode metallization atoms flow into the antifuse material is advantageously preselected.

In another embodiment, an apparatus for programming an integrated circuit having antifuse structures is disclosed. The apparatus includes:(1) a programming device including a programming receptacle configured to make electrical contact with leads of an integrated circuit having antifuse structures; (2) a waveform generator coupled to the programming device to provide a varying waveform for use by the programming device; and (3) a computer system coupled to the programming device to control the programming of the at least one antifuse structure of the integrated circuit by causing the programming device to apply the varying waveform to the programming receptacle. In this manner, the varying waveform is applied to the at least one antifuse structure.

These and other advantages of the present invention will become apparent upon reading the following detailed descriptions and studying the various figures of the drawings.

DETAILED DESCRIPTION OF THE PREFERRED EMBODIMENTS

FIG. 1 is a cross sectional view of a prior art programmed antifuse structure, which was discussed with reference to the prior art.

The present invention is directed at a method for programming an antifuse structure to establish substantially wider conduction paths which are formed near a center region of the antifuse structure. Programming the antifuse structure is preferably accomplished by applying an alternating current (AC) waveform having a peak voltage amplitude of between about 2 volts and 20 volts, and applying the AC waveform for a preferred programming time of between about 10 nanoseconds and about 1 second. Of course, the programming time will vary depending on the thickness of the antifuse layer being programmed.

A typical antifuse structure will preferably have a bottom electrode (e.g., "metal-one" layer) formed over a silicon wafer. The bottom electrode is formed by a conventional physical vapor deposition (PVD) process, such as sputtering. Once the bottom electrode is formed, the silicon wafer is placed into a chemical vapor deposition (CVD) chamber so that an antifuse layer (e.g., amorphous silicon) can be deposited. Preferably, the deposition process is carried out in a plasma enhanced chemical vapor deposition PECVD chamber. An intermediate oxide dielectric layer is then formed over the antifuse layer, and a via hole is etched through the intermediate dielectric layer to create a path down to the antifuse layer. A top electrode is then formed over the intermediate dielectric layer such that the top electrode material conformally fills the via hole.

Figure 2A:
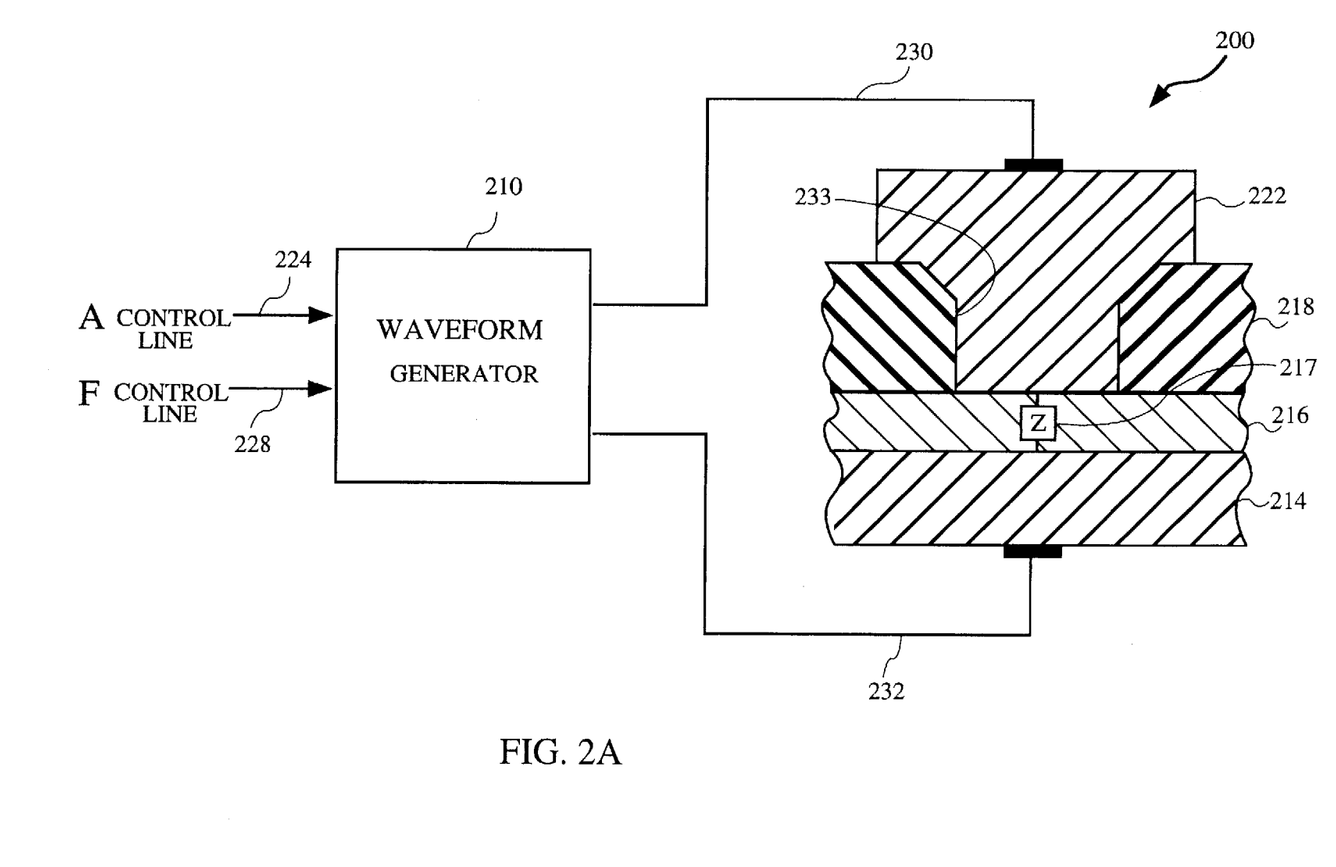
FIG. 2A is an illustration of a system for programming an antifuse structure in accordance with a preferred embodiment of this invention.

FIG. 2A shows an alternating current waveform generator 210 connected to a cross-section of a "test" antifuse structure 200 in accordance with one embodiment of the present invention. Waveform generator 210 can be any suitable generator capable of delivering non-DC current or "alternating" current waveforms to antifuse structure 200. By way of example, waveform generator 210 is preferably equipped with an amplitude control line 224 and a frequency control line 228. In this manner, waveform generator 210 can be adjusted to provide waveforms having a variety of voltage amplitudes, and frequency capabilities. Although waveform generator 210 can be any commercially available generator, a preferred waveform generator is a model FG 5010 waveform generator manufactured by Tektronix, Inc., of Beaverton, Oreg.

In one embodiment, waveform generator 210 is provided with a first electrode 230 connected to a top electrode 222 of antifuse structure 200. Electrode 232 is similarly shown connected to bottom electrode 214 of antifuse structure 200. In this manner, waveform generator 210 will preferably deliver programming voltage pulses to antifuse structure 200.

Antifuse structure 200, in its unprogrammed state, responds as a capacitor to alternating current, where electrode 222 acts as a top plate, electrode 214 acts as a bottom plate and amorphous silicon layer 216 acts as a dielectric material. Therefore, when an alternating current is applied between electrodes 222 and 214, the applied current will initially pass through the capacitor structure causing electrons to flow across the amorphous silicon layer 216. This should be contrasted with D.C. programming where no current passes until a breakdown voltage is reached (i.e., $V=V_{br}$). Thus, it is believed that the initial flow of electrons will progressively cause metallization material from at least one of electrode 222 and electrode 214 to migrate into amorphous silicon layer 216. In this manner, a conductive path progressively develops between electrodes 222 and 214, thereby creating a more stable and wider conductive path.

It should be appreciated that as current passes through the capacitor structure, the electric field "E" resulting between the plates will tend to be stronger near the edges of via hole 233. Consequently, the fringe electric field will have a longer path at the edges, and therefore the capacitance "C" will be less at the edges and greater near the center of the antifuse layer that lies under the via hole. Thus, it follows that the impedance will be lower away from the edges of via hole 233.

For example, since impedance "Z" is equal to 1/jwC, the magnitude of "Z" is equal to 1/wC. As the capacitance increases, the impedance Z 217 as shown in FIG. 2A naturally decrease causing increased conduction near the center of the via hole 233. Therefore, when alternating current is applied to an antifuse structure 200, the conducting path will naturally develop in a progressive manner near the center of the antifuse layer lying under the via hole (i.e., away from the edges).

Figure 2B:
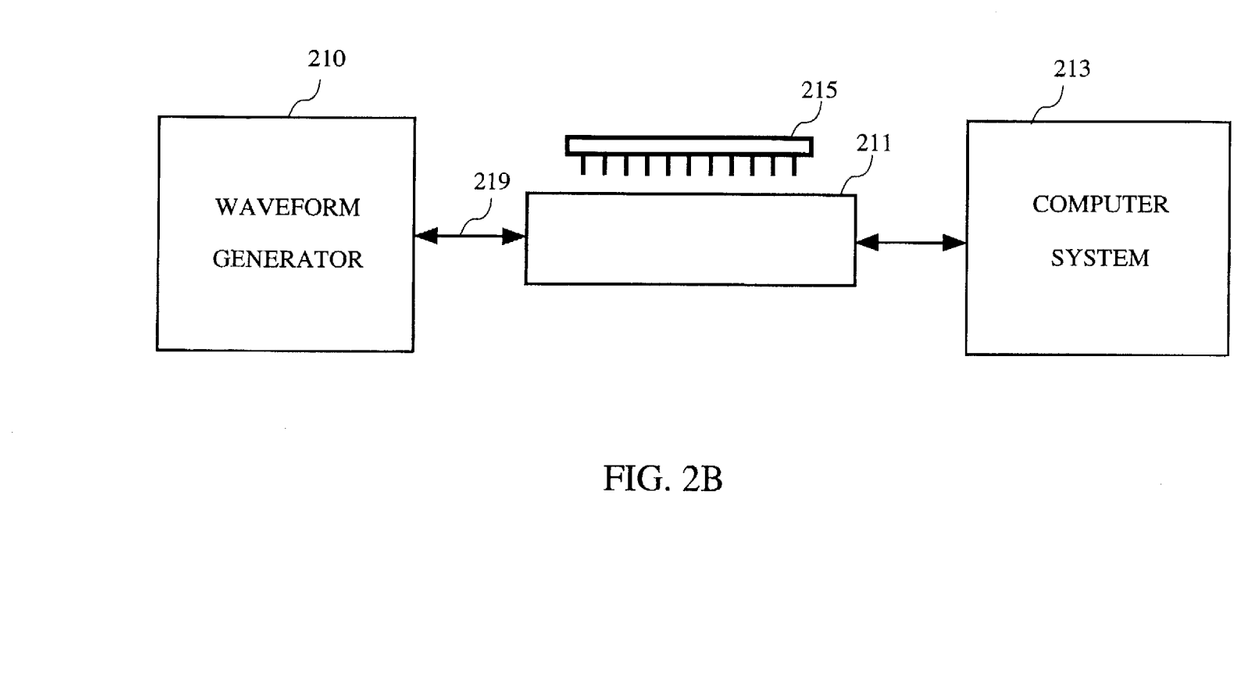
FIG. 2B is a system for programming an array of antifuse structures in accordance with a preferred embodiment of the is invention.

FIG. 2B is a programming apparatus for programming an integrated circuit device 215 including an array of antifuse structures. A programming receptacle 211, which is known as a "ZIF socket" is coupled to a waveform generator 210. As described above, waveform generator 210 is preferably suited to deliver non-DC programming waveforms to programming receptacle 211 during a programming operation. In this embodiment, a computer system 213 is coupled to programming receptacle 211 via a suitable serial-download connection cable 219. Computer system 213 is then loaded with appropriate user interface software for programming preselected antifuse structures in integrated circuit device 215.

As is well known in the art, the location of a particular antifuse structure selected for programming can be identified by applying the non-DC programming pulses (e.g., varying waveforms) to a particular vertical and horizontal track of antifuse structures. In practice, integrated circuit device 215 can be programmed by transferring a "programming file" from computer system 213 to programming receptacle 211 where it is stored on at least one SRAM memory device. A typical programming file will designate the particular antifuse structures that should be programed to meet a specific logic circuitry arrangement.

Once the programming file is stored on the SRAM, the programming information is transferred to the selected antifuse structures identified on integrated circuit device 215. For example, the programming information is electrically transferred from programming receptacle 211 to the conductive leads of integrated circuit device 215 during a programming operation. For more information on apparatuses used for programming antifuses arrays, reference can be made to an antifuse programming manual entitled "VLSI Technology vROM Programmer User Manual," which is available from VLSI Technology Inc. of San Jose, Calif. This manual is hereby incorporated by reference.

Figure 2C:
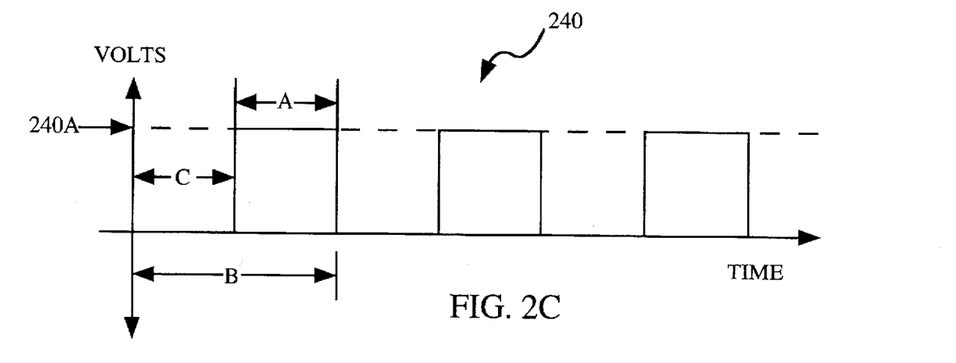
FIGS. 2C–2E are waveforms that are used in programming an antifuse structure in accordance with one preferred embodiment of this invention.
Figure 2D:
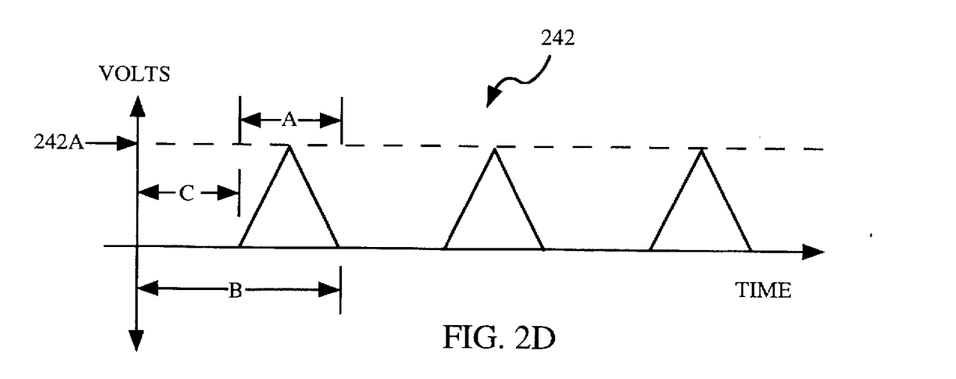
Figure 2E:
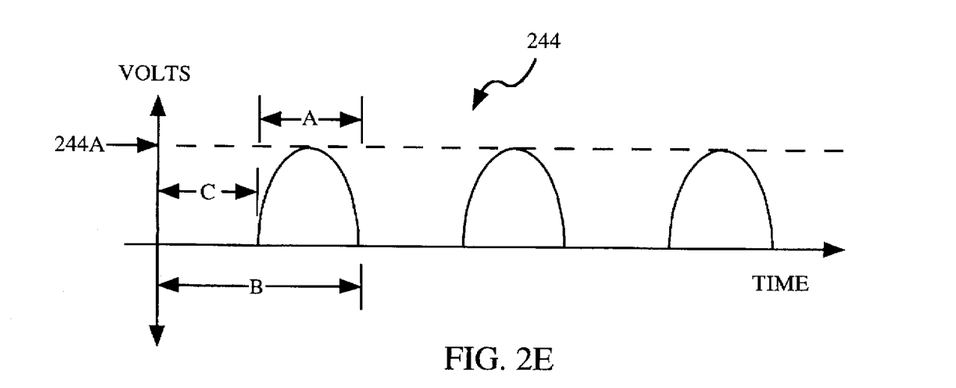

Referring now to FIGS. 2C–2E, there are shown three exemplar non-DC "alternating current" programming waveforms 240, 242, and 244 which are generated by waveform generator 210. By way of example, once applied, the waveform pulses will advantageously generate a wider potential linking filament with each successive AC pulse. In this embodiment, waveforms 240, 242, and 244 are shown having a positive pulse each half cycle. Although any suitable analog circuitry can be used to generate waveforms 240, 242 and 244, a half-wave rectifier which is well known to those skilled in the art can be used to generate the half-wave rectified waveforms from the output of a standard waveform generator. Further, it should be understood that although only positive pulses are shown, negative half-wave rectified pules can equally be applied to program antifuse structure 200.

In a preferred embodiment, a half-wave rectified alternating current square wave 240, triangular wave 242 or a sine wave 244 is preferably applied having a voltage amplitude of 240a, 242a or 244a respectively. As shown, the parameters associated with one cycle of each waveform are denoted by: (1) a pulse width of A; (b) a period of B; and (c) an off-time of C. In this manner, a positive voltage pulse is delivered to antifuse structure 200 such that the off-time intervals are no less than C. Further, depending on the polarity of the half-wave rectified alternating current pulses being applied, it is also possible to predetermine the direction from which metallization atoms will migrate from. As described herein, a pulse refers to a waveform originating at zero volts, rising to a peak voltage and returning back to zero volts.

In operation, the voltage amplitude of the selected programming pulses will generally depend on the thickness of amorphous silicon layer 216. By way of example, for amorphous silicon layers having a preferred thickness of between about 200 Å and 2,000 Å, the peak programming voltage amplitude (e.g., 240a, 242a and 244a) for each pulse is preferably between about +2 volts and +20 volts. For amorphous silicon layers having a more preferred thickness of between about 800 Å and 1,000 Å, the programming voltage amplitude is preferably between about +8 volts and +12 volts. Further, for amorphous silicon layers having a most preferred thickness of approximately 950 Å, the programming voltage amplitude is preferably approximately 10 volts. Of course, if negative half-wave rectified pluses are substituted for the positive half-wave rectified pulses, the peak programming voltage will be about the inverse of the voltages recited above.

In this embodiment, the frequency for the alternating current pulses is preferably between about 1 Hz and 100 MHz, and more preferably, between about 150 KHz and 250 KHz, and most preferably about 200 KHz. To assure appropriate programming of the various amorphous silicon layer thicknesses, pulses having the aforementioned voltage amplitudes are applied for a time of between about 10 nanoseconds and about 1 second for amorphous silicon layers having a thickness of between about 200 Å and 2,000 Å. More preferably, for a time of between about 15 milliseconds and 25 milliseconds for amorphous silicon layers having a thickness of between about 800 Å and 1,000 Å, and most preferably for a time of approximately 20 milliseconds for amorphous silicon layers having a thickness of approximately 950 Å.

As will be appreciated by those skilled in the art, although only exemplar square waves, triangular waves, and sine waves have been used to illustrate preferred methods of programming antifuse structure 200 of FIG. 2A, waveforms having suitable alternating current pulse parameters can be substituted therefor.

Figure 2F:
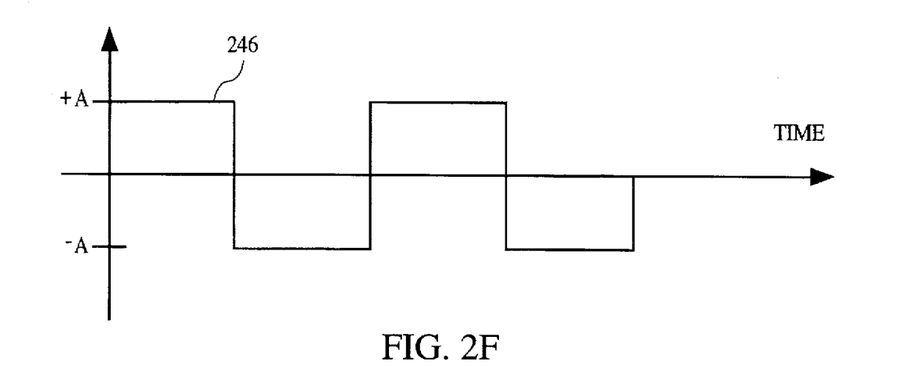
FIGS. 2F–2H are alternative waveforms that are used in programming an antifuse structure in accordance with another preferred embodiment of this invention.
Figure 2G:
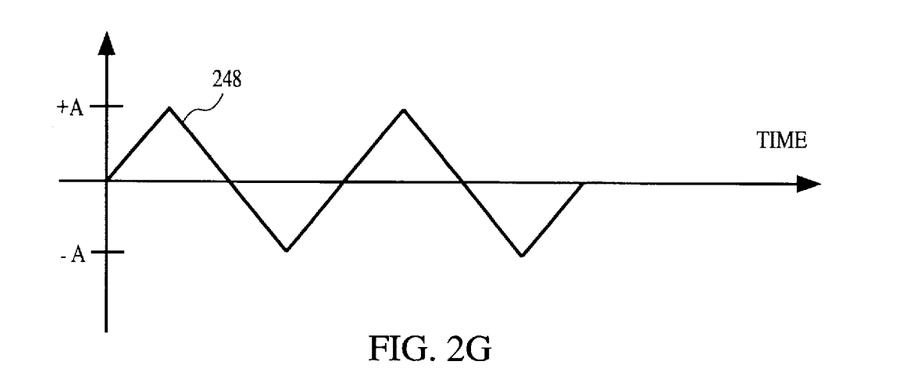
Figure 2H:
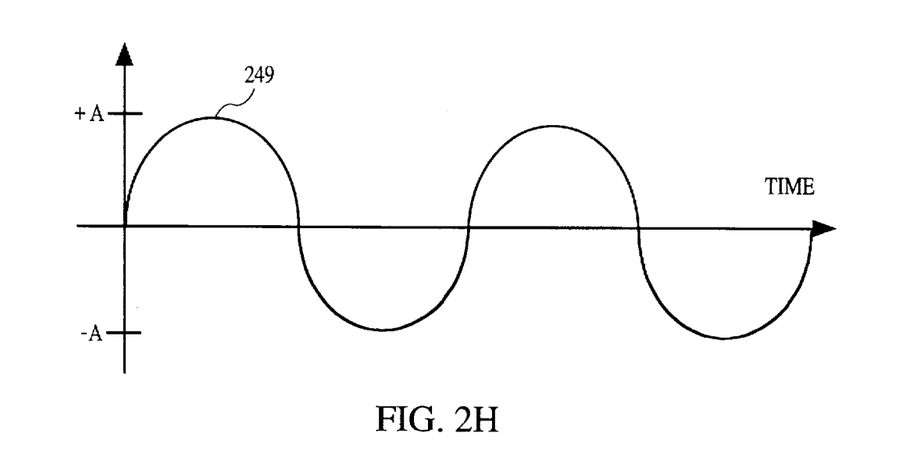

In an alternative embodiment, full square waves 246, triangular waves 248, and sine waves 249 as illustrated in FIGS. 2F–2H can be used to program antifuse structure 200. By way of example, as the full waves alternate between positive and negative half cycles, the polarity of the applied voltages will switch each half cycle. In this manner, for each complete cycle two pulses will be delivered to antifuse structure 200 of FIG. 2A, or antifuse structure array 215 of FIG. 2B.

As mentioned above, the amplitude of the positive and negative waveform pulses are preferably selected based on the thickness of the amorphous silicon layer being programmed. By way of example, the thicker the amorphous silicon layer, the higher the programming voltages to produce a sufficient electron flow between the metallization layers that sandwich the amorphous silicon layer. That is, the electron flow generated between the electrodes will incite metallization atoms from both top electrode 222 and bottom electrode 214 to incrementally migrate into the amorphous silicon antifuse layer during the successive positive and negative pulse.

For illustration purposes, when amorphous silicon layer 216 of FIG. 2A has a preferred thickness of between about 200 Å and 2000 Å, the programming voltage is preferably between about ±2 volts, and ±20 volts, and more preferably, for amorphous silicon layers having a more preferred thickness of between about 800 Å and 1,000 Å, the programming voltage is preferably between about ±9 volts and ±12 volts, and for a most preferred thickness of about 950 Å, the programming voltage is preferably about ±10 volts. As mentioned above, the programming time will also vary depending upon the thickness of antifuse layer 216.

However, since twice as many pulses are applied to the antifuse structure in this embodiment (e.g., a positive and a negative pulse each cycle), the programming time required to form a proper conduction path will be about half of the time required to program the antifuse layer with a half-wave rectified waveform. Therefore, the time period required for programming the amorphous silicon layer is preferably between about 5 nanoseconds and 1 second for amorphous silicon layers having a thickness of between about 800 Å and 1,000 Å, and most preferably for about 10 milliseconds for amorphous silicon layers having a thickness of about 950 Å. As described above, the programming frequency of the alternating current being applied will most preferably be about 200 KHz.

As described above, after the application of each programming pulse, metallization atoms from electrode 222 and electrode 214 will tend to migrate into the amorphous silicon layer 216 at approximately the center region where the impedance is lowest. Therefore, as more programming pulses are applied during a programming event, the amorphous silicon layer 216 will begin to form a conductive path at approximately the center region under top electrode 222. Therefore, as more positive and negative amplitude voltage pulses are applied to antifuse structure 200, the conduction path will be formed incrementally as each applied programming pulse causes electrons to flow across amorphous silicon layer 216. Advantageously, the delivery of both a positive and a negative pulse during a single cycle will tend to produce a wider conduction path which is formed from the migration of metallization atoms from both the top and bottom electrodes.

Figure 3A:
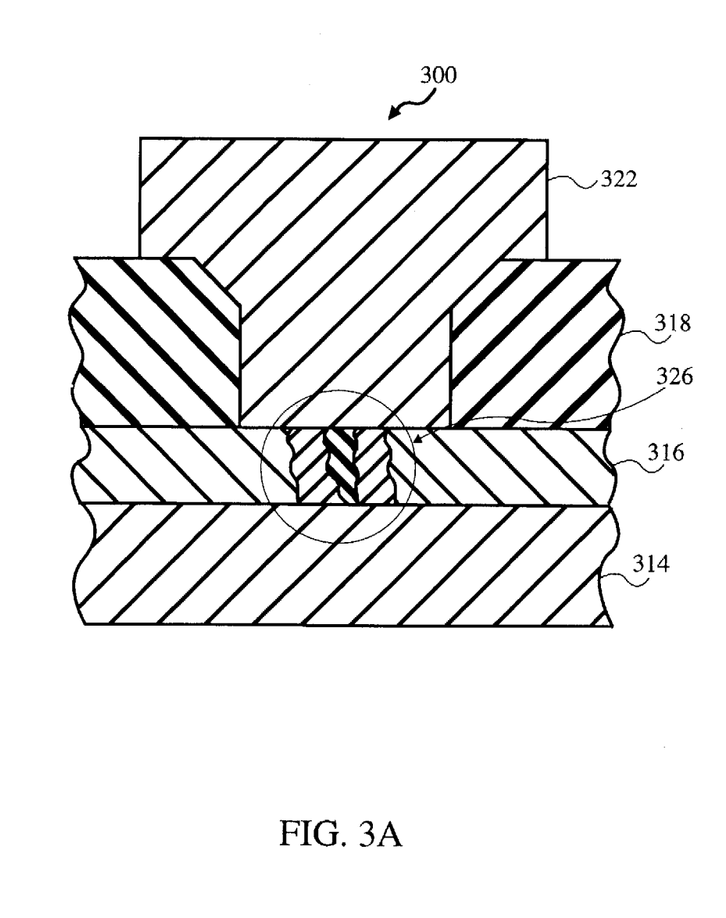
FIGS. 3A and 3B are cross-sectional views of an antifuse structure having a potential linking area formed beneath the center of the antifuse via hole created by the process of the present invention.
Figure 3B:
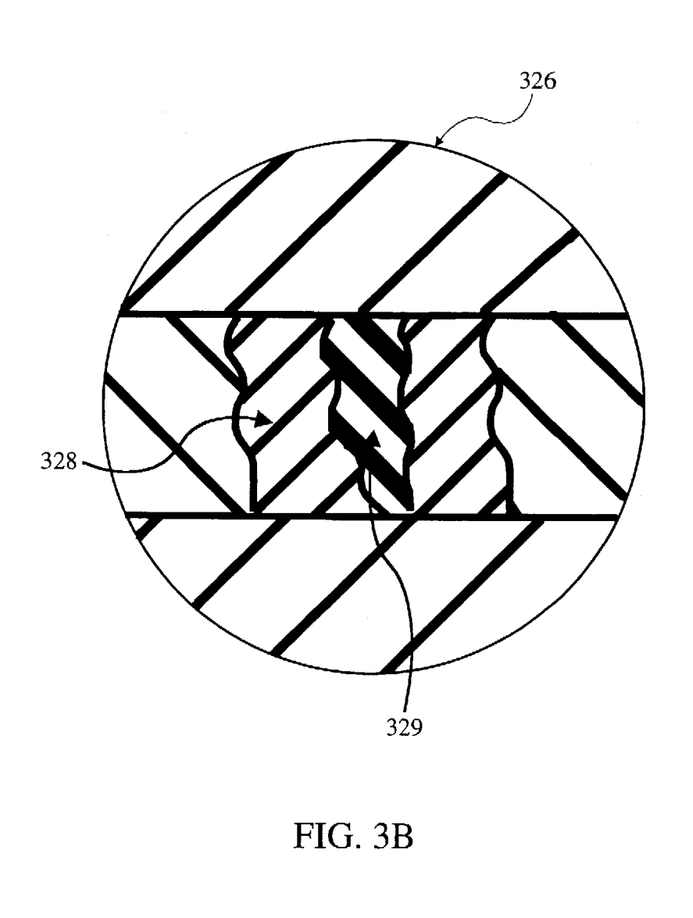

The resulting conduction path formed in the amorphous silicon layer by implementing alternating current pulses can be further appreciated with reference to a "programmed" amorphous silicon antifuse structure of FIGS. 3A and 3B. As described above, an antifuse structure 300 is formed having a bottom electrode 314, an amorphous silicon layer 316, an intermediate oxide (IMO) layer 318 having a via hole 310 extending to antifuse layer 316, and a top electrode 322 formed into via hole 310 and over intermediate oxide layer 318.

For illustration purposes, antifuse structure 300 will be a representative antifuse structure in a packaged array of antifuse structures 215 as shown in FIG. 2B. When an AC programming voltage is applied between bottom electrode 314 and top electrode 322 as described with reference to FIGS. 2A through 2H, it is believed that the conduction path (e.g., linking area) will resemble a pair of conducting filaments as magnified in 326 of FIG. 3B.

Referring now to FIG. 3B, magnification 326 shows a potential linking area of antifuse structure 300. Due to the electron flow generated when alternating current pulses are applied to antifuse structure 300, a polysilicon filament 328 (i.e., polycrystalline silicon) is formed having an approximate diameter of between about 1,000 Å and 2,000 Å, and more preferably, about 1,500 Å. Also shown is a silicide filament 329 which is believed to be formed by the electromigration of metallization material into amorphous silicon layer 316 during programming. Preferably, the diameter of the resulting silicide filament 329 is between about 300 Å and 800 Å, and more preferably about 500 Å.

It should be appreciated that programming antifuse structure with the aforementioned alternating current pules will typically produce polysilicon filaments 329 that are about twice as wide in diameter, and silicided filaments 329 that are by about one third larger in diameter than filaments produced by conventional direct current (D.C.) voltage programming.

Figure 4:
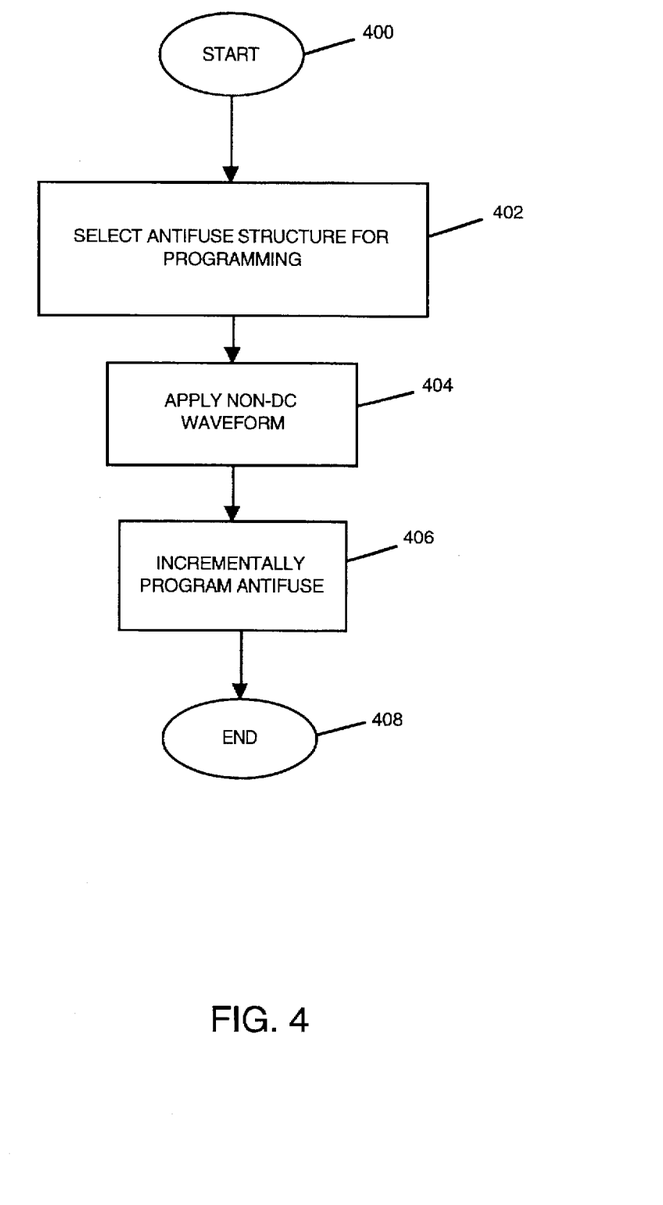
FIG. 4 is a flow chart representation of the steps associated with programming an amorphous silicon antifuse layer in accordance with a preferred embodiment of this invention.

The above-described embodiments can be further understood with reference to a flow chart presented in FIG. 4. The flow chart of FIG. 4 illustrates the method operations associated with programming an amorphous silicon antifuse structure in accordance with one embodiment of the present invention. The method starts at a block 400. From block 400, a suitable alternating current generator is preferably set up to deliver programming pulses to amorphous silicon antifuse structure 300 of FIG. 3A. As described above, the programming pulses are preferably square waves, triangular waves or sine waves. Although the voltage amplitude and programming time will vary depending on the thickness of the antifuse layer being programmed, a preferred antifuse structure will have an antifuse layer thickness of between about 800 Å and 1,000 Å. In this embodiment, the programming voltage magnitude of the programming pulses is preferably between about 8 volts and 12 volts, and the programming time is preferably between about 10 nanoseconds and about 1 second.

From block 400, the method proceeds to a block 402 where predefined antifuse structures are selected for programming. It should be appreciated that although only one exemplary antifuse structure is shown being programmed, the method of this embodiment can be applied to integrated circuits (ICs) having an array of antifuses (e.g., that can be selectively programmed to form predefined logic devices). Therefore, if a selected antifuse structure in the array of antifuses requires programming, particular vertical and horizontal tracks can be selected for programming one or more antifuses. Once the antifuse structures have been selected (as described with reference to FIG. 2B), and the alternating current generator has been powered up, the method proceeds to a block 404 where non-DC programming pulses are applied to the selected antifuse structures. As described above, the alternating current pulses can either be half-wave rectified or full waves (i.e., un-rectified) having a positive and negative voltage amplitude. It should be appreciated that half-wave rectified programming will cause the electromigration of metallization material into the amorphous silicon layer from either the top or bottom electrodes, while full waves will cause electromigration of metallization material into the amorphous silicon layer from both the top and bottom electrodes. In this manner, the electromigration alternates between top and bottom at about each half a cycle. As described above, a preferred frequency for the programming pulses is between about 150 KHz and 250 KHz.

While the programming alternating current pulses are being applied at block 404, the method proceeds to a block 406 where the antifuse links begins to form progressively. By way of example, the programmed antifuse will preferably resemble programmed antifuse structure 300 having a potential linking area substantially centered under the via hole where the impedance is lowest. At this point, the method proceeds to block 408 where programming apparatus can be applied to another antifuse array.

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope and equivalents of the appended claims.

What is claimed is:

1. A method for programming an antifuse structure comprising:

providing an antifuse structure including an antifuse material sandwiched between a bottom electrode and a top electrode;

applying an alternating current having alternating current pulses between said bottom and top electrodes, such that each of the alternating current pulses have substantially equal voltage magnitude, the alternating current therefore generates a conduction path having a silicided filament and a polysilicon filament, the conduction path is formed through said antifuse material substantially centered in said antifuse material, the alternating current having a frequency of between about 1 Hz and 100 MHz; and whereby the conduction path is formed incrementally from electron flow produced from each alternating current pulse.

2. A method for programming an antifuse structure as recited in claim 1, wherein said alternating current has a peak amplitude of between about 8 volts and about 12 volts.

3. A method for programming an antifuse structure as recited in claim 1, wherein said antifuse material is formed to a thickness of between about 200 Å and 2,000 Å.

4. A method for programming an antifuse structure as recited in claim 3, wherein the antifuse material is amorphous silicon.

5. A method for programming an antifuse structure as recited in claim 1, wherein the method further includes producing an integrated circuit having a functionality defined, at least in part, by programming a plurality of antifuse structures.

6. A method for programming an antifuse structure, the antifuse structure including a lower electrode, an amorphous silicon layer formed over the lower electrode, and an upper electrode formed over the amorphous silicon layer, the method for programming the antifuse structure comprising:

providing an alternating current generator capable of delivering a waveform having a plurality of programming pulses that each have a substantially equal voltage magnitude;

half-wave rectifying the plurality of programming pulses such that plurality of programming pulses are applied to the lower and upper electrodes of the antifuse structure at about every other half a cycle;

applying the waveform to said the lower electrode and upper electrode of the antifuse structure, thereby applying said plurality of programming pulses to said antifuse structure; and forming a conductive link through said amorphous silicon layer between said lower electrode and said upper electrode; and whereby the link is formed incrementally as the electron flow generated from each alternating current pulse causes electromigration of metallization material from said lower electrode and said upper electrode into the amorphous silicon layer.

7. The method for programming an antifuse structure as recited in claim 6, wherein said waveform is selected from the group consisting essentially of a square wave, a triangular wave and a sine wave.

8. The method for programming an antifuse structure as recited in claim 6, wherein the half-wave rectified programming pulses have a peak amplitude of between about 8 volts and about 12 volts.

9. The method for programming an antifuse structure as recited in claim 8, wherein the wherein the half-wave rectified programming pulses are delivered at a frequency of between about 1 Hz and 100 MHz.

10. The method for programming an antifuse structure as recited in claim 9, wherein the half-wave rectified programming pulses are delivered for a programming interval of between about 10 nanoseconds and about 1 second.

11. The method for programming an antifuse structure as recited in claim 6, wherein the method further includes producing an integrated circuit having a functionality defined, at least in part, programming a plurality of antifuse structures.

12. The method for programming an antifuse structure as recited in claim 6, wherein said amorphous silicon layer is formed to a thickness of between about 200 Å and 2,000 Å.

13. A method for programming an antifuse structure, the antifuse structure including a lower electrode, an amorphous silicon layer formed over the lower electrode, and an upper electrode formed over the amorphous silicon layer, the method for programming the antifuse structure comprising:

providing an alternating current generator capable of delivering a waveform having a plurality of programming pulses that each have a substantially equal voltage magnitude;

applying the waveform at a frequency of between about 1 Hz and 100 MHz to said the lower electrode and upper electrode of the antifuse structure for a programming interval of between about 5 nanoseconds and about 1 second, thereby applying said plurality of programming pulses to said antifuse structure; and forming a conductive link through said amorphous silicon layer between said lower electrode and said upper electrode, the conductive link has a silicided filament that is contained within a polysilicon filament, and said conductive link is formed in about a center of said antifuse structure; and whereby the link is formed incrementally as the electron flow generated from each alternating current pulse causes electromigration of metallization material from said lower electrode and said upper electrode into the amorphous silicon layer.

14. The method for programming an antifuse structure as recited in claim 13, wherein the method further includes producing an integrated circuit having a functionality defined, at least in part, programming a plurality of antifuse structures.

15. The method for programming an antifuse structure as recited in claim 13, wherein said amorphous silicon layer is formed to a thickness of between about 200 Å and 2,000 Å.

16. The method for programming an antifuse structure as recited in claim 13, wherein the plurality of programming pulses that are delivered to the antifuse structure electrodes have a positive polarity for about half a cycle and a negative polarity for about half a cycle.

17. The method for programming an antifuse structure as recited in claim 16, wherein the plurality of programming pluses have a peak magnitude of between about 8 volts and about 12 volts.

* * * * *